United States Patent [19]

Swanson

[11] Patent Number: 5,216,376
[45] Date of Patent: Jun. 1, 1993

[54] PULSE DURATION AMPLIFIER SYSTEM HAVING DISTORTION REDUCTION

[75] Inventor: Hilmer I. Swanson, Quincy, Ill.

[73] Assignee: Harris Corporation, Melbourne, Fla.

[21] Appl. No.: 896,393

[22] Filed: Jun. 10, 1992

[51] Int. Cl.[5] .............................................. H03F 3/38
[52] U.S. Cl. ...................................... 330/10; 330/149
[58] Field of Search ...................... 330/10, 207 A, 251, 330/124 R, 149

[56] References Cited

U.S. PATENT DOCUMENTS 4,554,512 11/1985 Aiello ...................................... 330/10

Primary Examiner—Steven Mottola
Attorney, Agent, or Firm—Tarolli, Sundheim & Covell

[57] ABSTRACT

An amplifier system is disclosed having distortion reduction. The system includes a pulse duration modulator having an input circuit for receiving an input signal, such as an audio signal, for providing a train of pulses exhibiting a fixed repetition rate and a fixed amplitude and having varying widths dependent upon the magnitude of the input signal. A switch is provided having an input circuit for receiving the PDM pulses and responds thereto so as to be on for a duration dependent upon the pulse width. The switch has an output circuit connected in series with a load across a DC voltage source to provide an amplified output signal to the load. A signal detector is connected to the output circuit to provide a correction signal having a value that various proportional to that of the amplified output signal. The input signal is divided by the correction signal prior to application to the input circuit of the pulse duration modulator.

8 Claims, 2 Drawing Sheets

PULSE DURATION AMPLIFIER SYSTEM HAVING DISTORTION REDUCTION

RELATED APPLICATION

This application is related to my co-pending U.S. patent application Ser. No. 675,537, filed Mar. 25, 1991 and entitled "RF Power Amplifier System Having Improved Distortion Reduction".

BACKGROUND OF THE INVENTION

The present invention relates to pulse duration amplifiers and, more particularly, to amplifiers having means for minimizing distortion.

Pulse duration modulation (PDM) is frequently employed in power amplifiers to achieve efficiency of operation. In such amplifiers, an input signal, such as an audio signal, is used to pulse modulate a carrier signal, and the resulting PDM signal is amplified. The amplified PDM signal is then filtered to recover a modulated signal corresponding to an amplified version of the input audio signal.

A polyphase PDM amplifier is disclosed in U.S. Pat. No. 4,164,714 to H. Swanson and assigned to the assignee herein. This patent discloses a system wherein an amplified signal is formed by combining the outputs of plural parallel-connected PDM amplifiers. All of the amplifiers respond to a common input signal, but have differently phased carrier signals. Polyphase PDM amplifiers of this type enjoy various advantages over earlier, single phase PDM amplifiers. For example, amplifier elements employed in polyphase PDM amplifiers operate at relatively low switching frequencies and power levels, permitting semi-conductor devices to be used as the active amplifier elements instead of vacuum tube devices.

The switching frequencies at which the PDM amplifiers operate serve to drive a switching device such as a semi-conductor to generate a train of squarewave pulses of fixed magnitude but variable pulse width in dependence on the on-off time durations of the semi-conductor switching device. It has been found that the amplitude of the amplified PDM signal may change in magnitude, resulting from variations in amplifier current or amplifier drive voltage or variations in the power supply voltage.

Circuits are known in the prior art for minimizing signal distortion in amplifier systems employed in an AM transmitter. The U.S. Pat. Nos. to H. Swanson et al. 4,737,731 and D. H. Covill 4,605,910 provide examples of such circuits. Each of these patents discloses circuitry for minimizing distortion resulting from variations in the DC power supply. In each case, a feed forward technique is employed in which a sample of the input DC voltage signal is obtained and is combined with the input audio signal to compensate for variations in the magnitude of the DC supply voltage prior to supplying the signal to the amplification stages of the transmitter. This feed forward technique, therefore, does not compensate for additional noise resulting as from noisy switches in the amplifier stages.

The U.S. Pat. No. 3,943,446 to D. L. Quidort discloses a system for controlling the output power of a broadcast transmitter employing a pulse width modulator having a triangular wave which is compared with an audio input. The output power is monitored and, in turn, controlled by varying the amplitude of the triangular wave relative to the audio input.

SUMMARY OF THE INVENTION

It is an object of the present invention to provide a PDM amplifier system having distortion reduction by detecting the PDM output signal and providing a feedback correction signal based thereon to correct for changes in the magnitude of the PDM amplified output signal.

It is contemplated that the amplifier system include a pulse duration modulator having an input circuit for receiving an input signal and providing a train of pulses exhibiting a fixed repetition rate and a fixed amplitude and having varying widths dependent upon the magnitude of the input signal. A switching means receives the pulses and responds thereto so as to be on for a duration dependent on the pulse width. The switching means has an output circuit connected in series with a load circuit across a DC voltage source to provide an amplified output signal to the load circuit. A signal detector is connected to the output circuit and provides a correction circuit having a value that varies proportional to that of the amplified output signal. A combiner divides the input signal by the correction signal to obtained a combined signal for application to the input circuit of the pulse duration modulator.

BRIEF DESCRIPTION OF THE DRAWINGS

The foregoing and other objects and advantages of the present invention will become more readily apparent from the following description as taken on conjunction with the accompanying drawings, wherein.

DESCRIPTION OF PREFERRED EMBODIMENT

Figure 1:
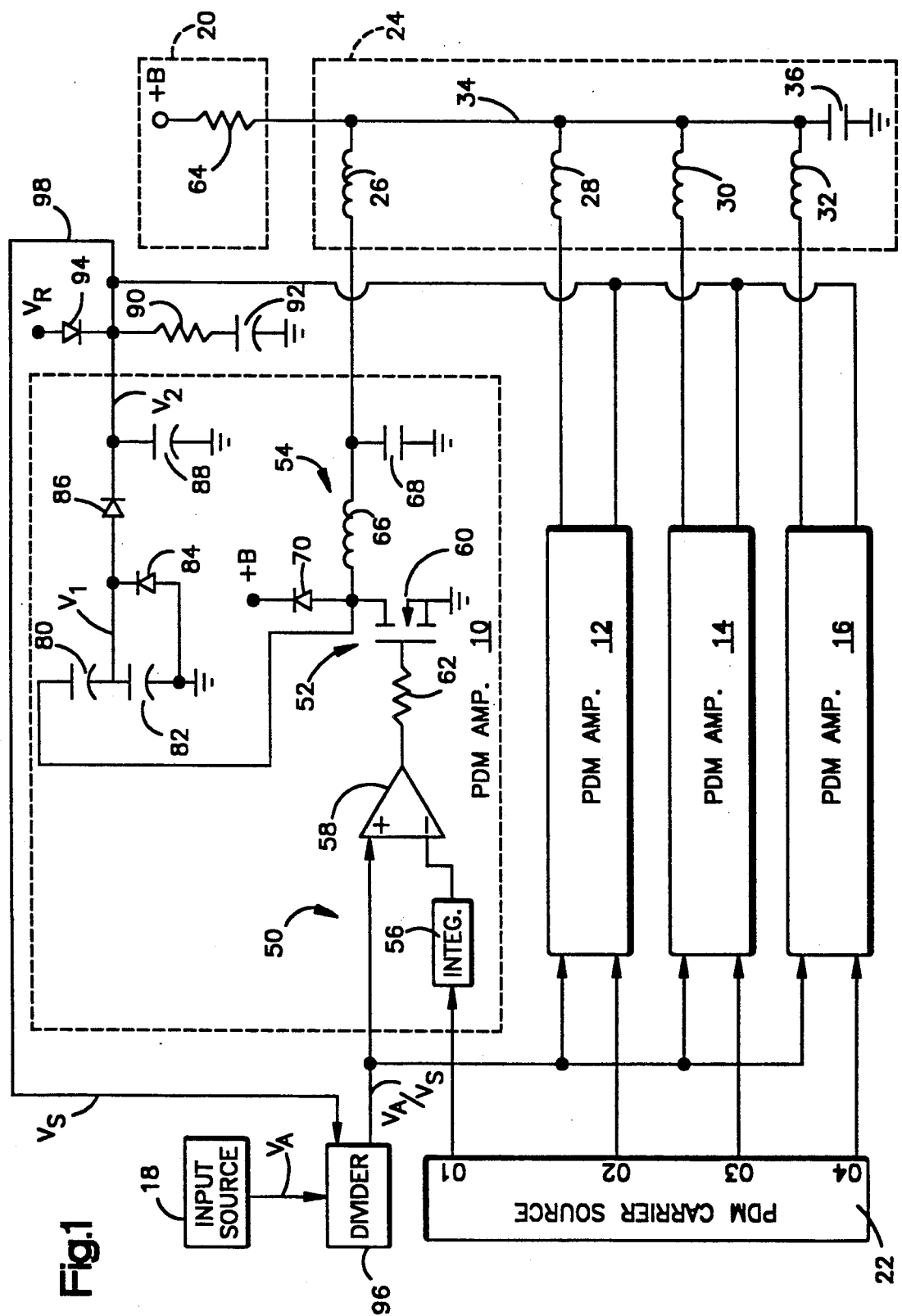
FIG. 1 is a schematic-block diagram illustration of an amplifier system constructed in accordance with the present invention.

FIG. 1 illustrates a polyphase PDM amplifier incorporating the present invention. The polyphase PDM amplifier includes plural PDM amplifier stages 10, 12, 14 and 16 connected in parallel between a common input source 18 and a common output device 20. Each amplifier stage receives a modulating input signal and a PDM carrier signal. The four stages 10, 12, 14 and 16 receive the same modulating input signal provided by an input source 18, but receive different carrier signals. The carrier signals provided to the four PDM amplifier stages 10, 12, 14 and 16 are all generated by a PDM carrier source 22 which generates four squarewave signals of common frequency but different phase. These four carrier frequencies are preferably equally displaced in phase. More particularly, the four carrier signals are displaced in phase by 90° with respect to one another whereby the four carrier signals have relative phases of 0°, 90°, 180°, and 270°.

The PDM amplifier stages are all identical to stage 10, which is shown in detail in FIG. 1 and will be described hereinafter. Generally, each stage pulse duration modulates its respective PDM carrier signal provided by PDM carrier source 22, amplifies the resulting PDM signal, and thereafter filters the amplified PDM signal to recover an amplified input signal. The amplified signal is, in each case, applied to the amplifier output.

The four amplified signals provided by the four PDM amplifier stages are combined in a combiner circuit 24 to form a combined amplified signal for application to the output device 20. The combiner circuit may, of course, take many forms, but is shown in FIG. 1 as including inductors 26, 28, 30 and 32, each connected between the output of a corresponding PDM amplifier stage and a common node 34, which represents the output of the combiner. A capacitor 36 is connected between the common node 34 and ground. The inductors and capacitor not only add the four amplifier output signals together, but also provide an additional stage of filtering. Each of the inductors 26–32 represents the "series" element of a half section low-pass filter, where the capacitor 36 represents the single, common "shunt" element for all of the filters.

The combined amplified signal appears on the common node 34, which represents the output of the polyphase PDM amplifier. Any suitable utilization device 20 may be connected to the output of the polyphase PDM amplifier for using the amplified signal which it provides.

FIG. 1 also shows one exemplary form which the amplifier stage 10 may take. The amplifier stage 10 is shown as including a PDM modulator 50, a pulse amplifier 52, and a PDM filter 54. The PDM modulator includes an integrator 56 and a comparator 58. The integrator 56 integrates the squarewave carrier signal provided by carrier source 22 to provide a triangular wave signal of similar frequency and phase on its output. The comparator 58 has its noninverting (+) input connected to input source 18 and its inverting (−) input connected to the output of the integrator 56. When thus connected, the output of comparator 58 will be at a high voltage level (e.g., +B) when the input signal is greater than the instantaneous level of the triangular wave, and a low voltage level (e.g., ground potential) when the input signal is below the instantaneous level of the triangular wave. As long as the input signal level is below the peak level of the triangular wave, the output of the comparator is a pulse duration modulated signal.

The pulse duration modulated signal is a bilevel signal comprised of periodic pulses of fixed frequency (the frequency of the triangular wave) and variable duration. The duration of the pulses is related to the level of the input signal. In the example being described, the pulse duration is directly proportional to input signal level.

The PDM signal is amplified by a pulse amplifier 52, which in FIG. 1 is shown as a conventional single transistor, class "D" amplifier. The amplifier includes a field effect transistor 60 (FET) whose gate is connected to the output of comparator 58 through a current limiting resistor 62. The FET 60 is connected to the amplifier output through filter 54. The amplifier output is in turn connected to a DC supply voltage (+B) through a load 20, which is characterized as a resistor 64 in FIG. 1.

The FET's drain-source current path is therefore connected in series with filter 54 and load 20 across a +B supply. The conductive state of transistor 60 switches in unison with the PDM signal, thereby applying an amplified PDM signal across filter 54 and load 20.

The low-pass filter 54 filters the amplified PDM signal to recover an amplified input signal. The filter includes an inductor 66 and capacitor 68. The capacitor is connected between the amplifier output and ground. The values of inductor 66 and capacitor 68 are selected so that the filter has a cutoff frequency above the highest frequency of the input signal and below the frequency of the PDM carrier signals provided by PDM carrier signal source 22. A free wheeling diode 70 is connected between the transistor 60 and the +B supply to clip the inductive spikes.

The transistor 60 serves as a switch which is turned on by the PDM signal and remains on for a time duration dependent on the width of the PDM signal. Transistor 60 has an output circuit which is connected in series with inductors 66 and 26 and load 64 across the DC supply voltage (+B). It is the PDM amplified signal that is presented in this output circuit that may vary in magnitude dependent on amplifier current, amplifier drive voltage and variations in the power supply voltage. Any changes in the magnitude of the signal will result in a distorted output from the transmitter.

The present invention provides circuitry for correcting for such variations in the PDM amplified signal and thereby minimizing distortion. As can be seen from the discussion that follows, the circuitry employed serves to detect the PDM amplified signal in the output circuit of the transistor switch 60. The detector circuit provides a DC correction signal having a magnitude which varies proportional to that of the PDM amplified signal. This correction signal is then employed in a feedback network to correct for changes in the PDM amplified output signal. As will be brought out herein, this can be extended to a polyphase system wherein the outputs of several phases may be gated together so that a failure of any one amplifier will not remove the feedback correction signal. A DC voltage $V_R$ is also gated into the network to limit the range of the feedback correction signal.

Reference is now made to the circuitry in FIG. 1 from which it will be noted that the output circuit of transistor 60 is connected to a detector circuit including a pair of capacitors 80 and 82 which are connected in series to ground. This provides a reduced voltage, such as on the order of about 10 volts across capacitor 82. The detector circuit also includes a diode 84 connected across capacitor 82. The junction of capacitors 80 and 82 is connected to a rectifying diode 86. A capacitor 88 connects the anode of diode 86 to ground. The junction of diode 86 and capacitor 88 is connected to a similar point in each of the other PDM amplifiers 12, 14 and 16, as shown in FIG. 1. A series circuit, such as a resistor 90 and a capacitor 92, may connect this point to ground and by way of a diode 94 to a DC reference source $V_R$.

In operation, the output of the amplifier transistor 60 appears across a voltage divider comprised of capacitors 80 and 82 providing a step-down voltage on the order of about 10 volts across capacitor 82. The diode 84 clamps the pulse train out of the amplifier at approximately 0 volts. That is, the pulses may have a positive value at about 10 volts but do not go negative below 0 volts. Thus, the voltage $V_1$ at this point (the junction of capacitors 80 and 82 and diode 84) is a positive-going voltage clamped at 0 volts. Diode 86 rectifies the voltage $V_1$ and produces an envelope that is proportional to the peak amplitude of the PDM pulse train. This voltage $V_2$ at the junction of diode 86 and capacitor 88 is employed to correct the gain of the amplifier whenever the peak voltage out of the amplifier changes. This signal is employed in a feedback network to correct for changes in the PDM amplifier output.

A positive DC voltage $V_R$ is supplied by way of diode 94 to the junction of diode 86 and capacitor 88 to ensure that a positive signal is supplied to the divider 96 by way of a feedback path 98. This positive voltage $V_R$ serves to limit the range of the feedback signal. Providing that the output voltage $V_2$ exceeds that of the reference voltage $V_R$, then the feedback signal $V_s$ supplied to the divider 96 will essentially correspond with the voltage $V_2$. The feedback voltage $V_s$ is combined with the audio input voltage $V_A$ obtained from the input source 18 so as to cancel any variations in the output signal which might be caused by variations in line voltage used to provide the B+ level and due to variations in impedances in the various power amplifiers, such as when several amplifiers are turned on.

Figure 2:
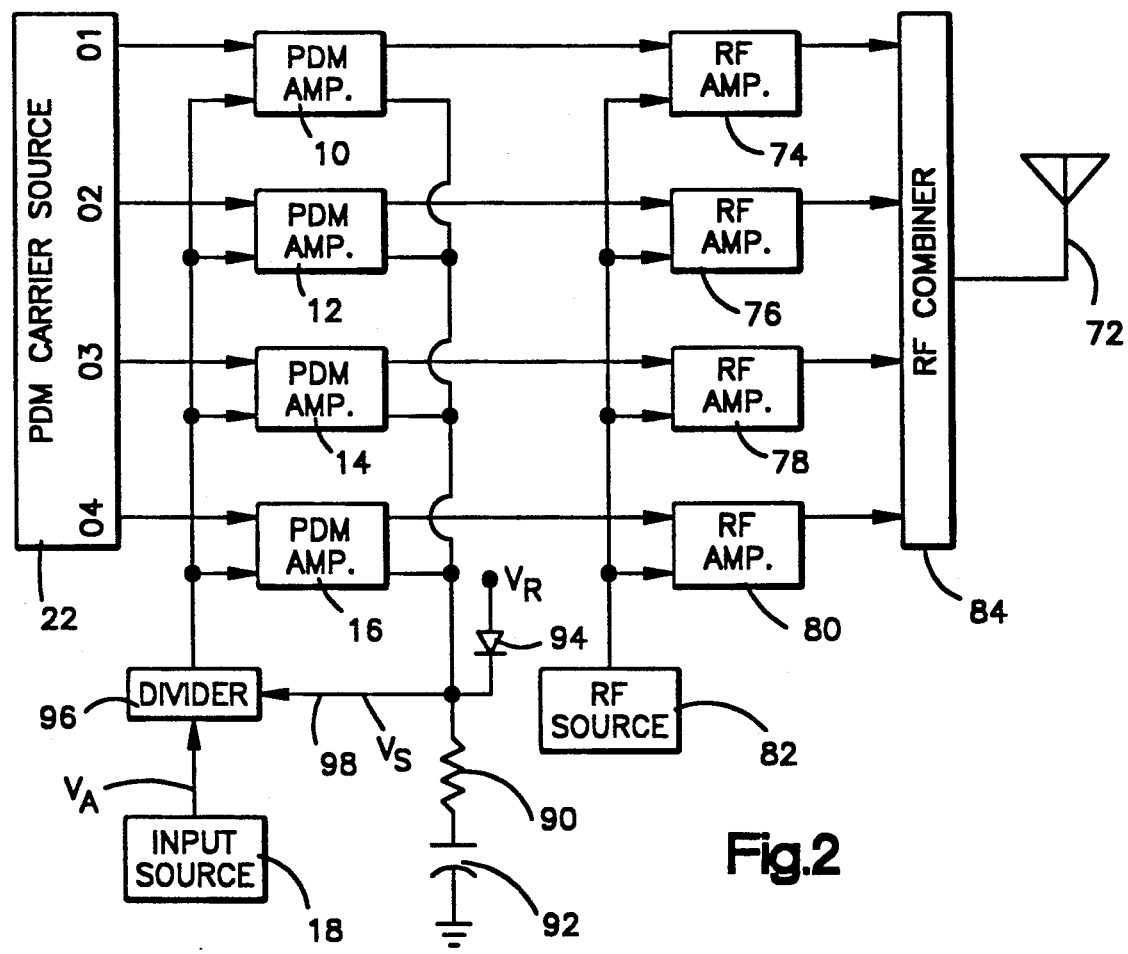
FIG. 2 is a schematic-block diagram illustration of another embodiment of the invention wherein plural PDM output signals each modulate a corresponding RF carrier signal.

FIG. 2 shows the use of the invention in an RF amplitude modulator embodiment. In this Figure the output device is shown as comprising a broadcast antenna 72. As in the FIG. 1 embodiment, a PDM carrier source 22 is included which generates four common frequency, differently phased squarewave signals for application to corresponding PDM amplifier stages 10, 12, 14 and 16.

In FIG. 2, however, the combiner has a quite different form than in FIG. 1. In FIG. 2, the amplifier output signals are combined by first using each to amplitude modulate a corresponding RF carrier signal, with the resulting amplitude modulated carrier signals being combined to form a combined amplitude modulated carrier signal.

To this end, the output of each PDM amplifier is connected to an input of a corresponding one of four RF amplifiers 74, 76, 78 and 80. Each RF amplifier amplifies the RF carrier signal provided by RF carrier source 82. Each PDM amplifier output signal modulates the power supply of its associated RF amplifier, thereby amplitude modulating the RF carrier signal being provided at the RF amplifier output. An RF combiner 84 receives all of the amplitude modulated RF carrier signals, combines them, and provides the resulting combined signal to the broadcast antenna 72.

Each of the PDM amplifier stages 10, 12, 14 and 16 in the embodiment of FIG. 2 are structured in the same manner as that of FIG. 1 and, consequently, each has the detector circuitry incorporated therein in the same sense as that of amplifier stage 10 described herein with reference to FIG. 1. The output of each of these amplifier stages 10, 12, 14 and 16 is connected, as in the embodiment of FIG. 1, to a feedback path 98 to a divider 96 which divides the audio input voltage $V_A$ by the feedback voltage $V_s$ to correct for any changes in the magnitude of the PDM amplified signal.

Although the invention has been described with respect to preferred embodiments, it will be appreciated that various modifications may be made without departing from the spirit and scope of the invention as defined by the appended claims.

Having described the invention, the following is claimed:

1. An amplifier system having distortion reduction and comprising:
   a DC voltage source;
   means for providing an input signal;
   pulse duration modulator means having an input circuit for receiving said input signal for providing a train of pulses exhibiting a fixed repetition rate and normally a fixed amplitude and having varying widths dependent upon the magnitude of said input signal;
   switching means having an input circuit for receiving said pulses and being responsive thereto so as to be on for a duration dependent upon the pulse width thereof;
   said switching means having an output circuit connected in series with a lead across said DC voltage source so as to provide an amplified output signal to said load;
   signal detector means connected to said output circuit for detecting any said amplified output signal and providing a correction signal having a value which varies proportional to the peak amplitude of said amplified output signal; and
   combining means for dividing said input signal by said correction signal to obtain a combined signal for application to the input circuit of said pulse duration modulator means.

2. An amplifier system having distortion reduction and comprising:
   a DC voltage source;
   means for providing an input signal;
   pulse duration modulator means having an input circuit for receiving said input signal for providing a train of pulses exhibiting a fixed repetition rate and normally a fixed amplitude and having varying widths dependent upon the magnitude of said input signal;
   switching means having an input circuit for receiving said pulses and being responsive thereto so as to be on for a duration dependent upon the pulse width thereof;
   said switching means having an output circuit connected in series with a load across said DC voltage source so as to provide an amplified output signal to said load;
   signal detector means connected to said output circuit for detecting any said amplified output signal and providing a correction signal having a value which varies proportional to that of said amplified output signal; and
   combining means for dividing said input signal by said correction signal to obtain a combined signal for application to the input circuit of said pulse duration modulator means;
   said signal detector means includes rectifying means for providing said correction signal as a DC signal of a magnitude proportional to that of said detected output signal.

3. An amplifier system having distortion reduction and comprising:
   a DC voltage source;
   means for providing an input signal;
   pulse duration modulator means having an input circuit for receiving said input signal for providing a train of pulses exhibiting a fixed repetition rate and normally a fixed amplitude and having varying widths dependent upon the magnitude of said input signal;
   switching means having an input circuit for receiving said pulses and being responsive thereto so as to be on for a duration dependent upon the pulse width thereof;
   said switching means having an output circuit connected in series with a load across said DC voltage source so as to provide an amplified output signal to said load;
   signal detector means connected to said output circuit for detecting any said amplified output signal and providing a correction signal having a value which varies proportional to that of said amplified output signal; and combining means for dividing said input signal by said correction signal to obtain a combined signal for application to the input circuit of said pulse duration modulator means;

said signal detector means includes a signal divider including first and second impedances connected together in series across said switching means.

4. An amplifier system as set forth in claim 3 wherein each of said first and second impedances is a capacitor.

5. An amplifier system as set forth in claim 4 wherein said second impedance is a capacitor connected between ground and said first impedance for providing a voltage which is proportional to that of said output signal.

6. An amplifier system as set forth in claim 5 including a diode connected across said second capacitor for clamping the voltage thereacross to zero volts so that the voltage is a positive-going voltage clamped at zero volts.

7. An amplifier system as set forth in claim 3 wherein said signal detector means includes rectifying means connected to said signal divider for providing said correction signal as a DC signal of a magnitude proportional to that of said detected output signal.

8. An amplifier system having distortion reduction and comprising:
 a DC voltage source;
 means for providing an input signal;
 pulse duration modulator means having an input circuit for receiving said input signal for providing a train of pulses exhibiting a fixed repetition rate and normally a fixed amplitude and having varying widths dependent upon the magnitude of said input signal;

switching means having an input circuit for receiving said pulses and being responsive thereto so as to be on for a duration dependent upon the pulse width thereof;

said switching means having an output circuit connected in series with a load across said DC voltage source so as to provide an amplified output signal to said load;

signal detector means connected to said output circuit for detecting any said amplified output signal and providing a correction signal having a value which varies proportional to that of said amplified output signal; and combining means for dividing said input signal by said correction signal to obtain a combined signal for application to the input circuit of said pulse duration modulator means;

a plurality of said pulse modulator means and a like plurality of said switching means and a like plurality of said signal detector means so that each said signal detector means provides a said correction signal and means for summing said correction signals together to provide a combined correction signal for application to said combining means for dividing said input signal by said combined correction signal to obtain a said combined signal for application to the input circuit of said pulse duration modulator means.

* * * * *